US009997352B2

(12) United States Patent
Bi et al.

(10) Patent No.: US 9,997,352 B2
(45) Date of Patent: *Jun. 12, 2018

(54) POLYSILICON RESIDUE REMOVAL IN NANOSHEET MOSFETS

(71) Applicant: INTERNATIONAL BUSINESS MACHINES CORPORATION, Armonk, NY (US)

(72) Inventors: Zhenxing Bi, Niskayuna, NY (US); Donald F. Canaperi, Bridgewater, CT (US); Thamarai S. Devarajan, Albany, NY (US); Nicolas J. Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/466,420

(22) Filed: Mar. 22, 2017

(65) Prior Publication Data
US 2018/0090315 A1    Mar. 29, 2018

Related U.S. Application Data

(63) Continuation of application No. 15/278,958, filed on Sep. 28, 2016, now Pat. No. 9,679,780.

(51) Int. Cl.
*H01L 21/3065* (2006.01)
*H01L 21/02* (2006.01)
(Continued)

(52) U.S. Cl.
CPC .... *H01L 21/02334* (2013.01); *H01L 21/0206* (2013.01); *H01L 21/02123* (2013.01);
(Continued)

(58) Field of Classification Search
CPC ......... H01L 21/30604; H01L 21/02063; H01L 21/02532; H01L 21/02595; H01L 21/3065;
(Continued)

(56) References Cited

U.S. PATENT DOCUMENTS 7,250,085 B2    7/2007    Abbadie et al.
7,800,152 B2    9/2010    Zhu et al.
(Continued)

OTHER PUBLICATIONS

List of IBM Patents or Patent Applications Treated as Related dated Mar. 22, 2017, 2 pages.
(Continued)

*Primary Examiner* — Mark Tornow
(74) *Attorney, Agent, or Firm* — Tutunjian & Bitetto, P.C.; Vazken Alexanian

(57) ABSTRACT

A method is presented for forming a semiconductor device. The method includes depositing a sacrificial layer on a fin structure formed on a substrate and then filled with polysilicon, etching a portion of the polysilicon material via a first etching process, and pre-cleaning the surface native oxide layer. The method further includes etching the remaining polysilicon material via a second etching process, and removing polysilicon etch residue formed adjacent the fin structure by a cleaning process. The pre-cleaning is performed by applying ammonia ($NH_3$) and nitrogen trifluoride ($NF_3$) or by applying buffered hydrofluoric acid (BHF). The first etching process is reactive ion etching (RIE) and the second etching process involves applying nitrogen trifluoride ($NF_3$) and hydrogen gas ($H_2$).

20 Claims, 7 Drawing Sheets

(51) Int. Cl.
  *H01L 29/165* (2006.01)
  *H01L 21/311* (2006.01)
  *H01L 21/8234* (2006.01)
  *H01L 29/78* (2006.01)
  *H01L 29/06* (2006.01)

(52) U.S. Cl.
  CPC ............................ *H01L 21/31111* (2013.01); *H01L 21/823431* (2013.01); *H01L 29/0665* (2013.01); *H01L 29/165* (2013.01); *H01L 29/785* (2013.01)

(58) Field of Classification Search
  CPC ..... H01L 21/823412; H01L 21/823431; H01L 29/0673; H01L 29/66545; H01L 29/66795
  See application file for complete search history.

(56) References Cited

U.S. PATENT DOCUMENTS

| | | |
|---|---|---|
| 8,431,453 B2 | 4/2013 | Huang et al. |
| 8,916,477 B2 | 12/2014 | Thedjoisworo et al. |
| 8,941,184 B2 | 1/2015 | Ando et al. |
| 8,969,934 B1 | 3/2015 | Cheng et al. |
| 9,093,533 B2 | 7/2015 | Cheng et al. |
| 9,324,576 B2 | 4/2016 | Zhang et al. |
| 9,679,780 B1 * | 6/2017 | Bi ................... H01L 21/30604 |
| 2010/0099263 A1 | 4/2010 | Kao et al. |

OTHER PUBLICATIONS

Park et al., "Etch Profile Control of High-Aspect Ratio Deep Submicrometer α-Si Gate Etch", IEEE Transactions on Semiconductor Manufacturing. vol. 14, No. 3. Aug. 2001. pp. 242-254.

* cited by examiner

US 9,997,352 B2

POLYSILICON RESIDUE REMOVAL IN NANOSHEET MOSFETS

BACKGROUND

Technical Field

The present invention relates generally to semiconductor devices, and more specifically, to polysilicon (poly-Si) residue removal in metal oxide semiconductor field effect transistor (MOSFET) nanosheets.

Description of the Related Art

The need to remain cost and performance competitive in the production of semiconductor devices has driven integrated circuits to increased device density. To facilitate the increase in device density, new technologies are constantly needed to allow the feature size of these semiconductor devices to be reduced. The push for ever increasing device densities is particularly strong in complementary metal oxide semiconductors (CMOS) technologies such as in the design and fabrication of field effect transistors (FETs).

During the construction of an integrated circuit structure, a polysilicon layer can be formed which covers a raised portion or step on the integrated circuit structure. Such a step can, for example, include an oxide portion such as an isolation oxide or an oxide-covered polysilicon line. Subsequent masking and anisotropic etching of this polysilicon layer, for example, to form another polysilicon line, can result in undesirable residues being left behind on the sidewalls of the polysilicon lines on the integrated circuit structure after the anisotropic etching step.

SUMMARY

In accordance with an embodiment, a method is provided for forming a semiconductor structure. The method includes depositing a sacrificial layer on a fin structure formed on a substrate and then filled with polysilicon, etching a portion of the polysilicon material via a first etching process, pre-cleaning the polysilicon surface native oxide layer, etching the remaining polysilicon material layer via a second etching process, and removing polysilicon residue formed adjacent the fin structure by a cleaning process.

In accordance with another embodiment, a method is provided for forming a semiconductor structure. The method includes etching a portion of a polysilicon material deposited on a fin structure of a substrate via a low rate etching process, pre-cleaning the native oxide layer, etching the remaining polysilicon material via a high rate etching process, and removing residue formed adjacent the fin structure by a wet etching cleaning process.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
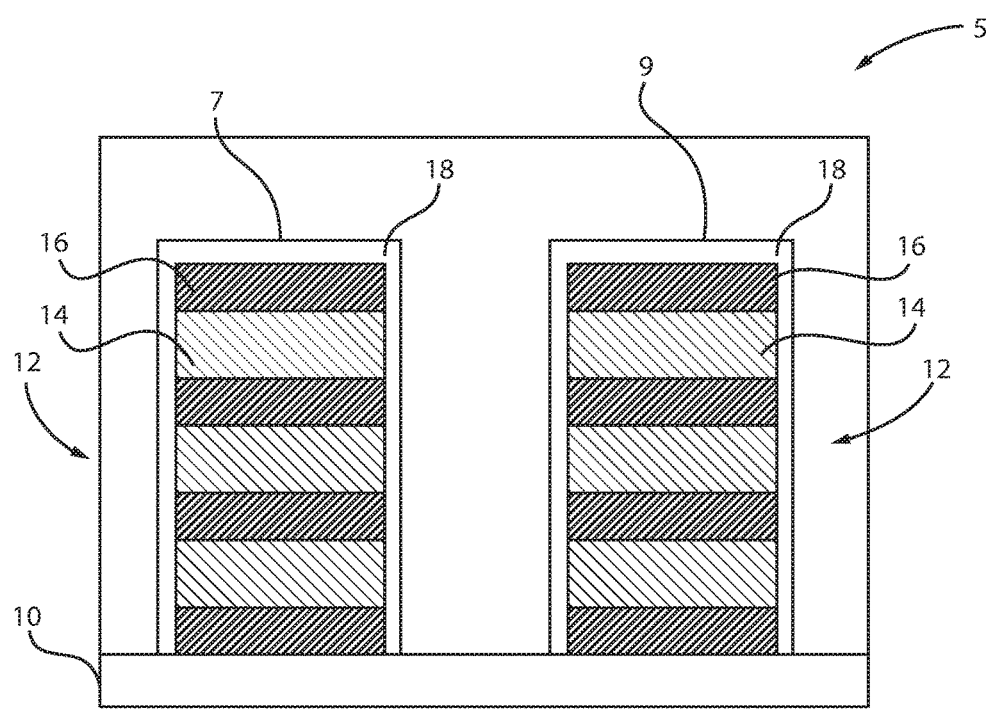
FIG. 1 is a cross-sectional view of a semiconductor structure including at least one fin structure formed on a substrate, the at least one fin structure surrounded by poly-Si, in accordance with an embodiment of the present invention.

Embodiments of the present invention relate generally to the formation of a semiconductor device. The formation includes depositing a sacrificial layer on a fin structure formed on a substrate, etching a portion of the sacrificial layer via a first etching process, pre-cleaning the sacrificial layer, etching the remaining sacrificial layer via a second etching process, and removing poly-Si residue formed adjacent the fin structure by a cleaning process.

Embodiments of the present invention relate generally to the formation of a semiconductor device. The formation includes etching a portion of a sacrificial layer deposited on a fin structure of a substrate via a low rate etching process, pre-cleaning the sacrificial layer, etching the remaining sacrificial layer via a high rate etching process, and removing residue formed adjacent the fin structure by a WETs RT SC1/SC2 cleaning process.

In one or more embodiments, the methods achieve a high aspect ratio (AR) structure with a residue free poly pull process, an isotropic process from the radical etch that leads to complete polysilicon removal, and a poly pull process that is not sensitive to incoming pitch walking.

In one or more embodiments, a novel dummy Si gate pull process for a nanosheet MOS transistor is presented, which includes (i) $NH_3+NF_3$ (ammonia and nitrogen trifluoride) or BHF (buffered hydrofluoric acid) for native oxide ex-situ breakthrough, (ii) purely gas phase $NF_3+H_2$ (nitrogen trifluoride and hydrogen gas) etch process with remote plasma source for Si etch, and (iii) RT SC1/SC2 post clean to remove by-product.

In one or more embodiments, the method includes forming nanosheet fins with $SiO_2$ liner and filled with dummy Si, performing partial poly-Si reactive ion etching (RIE), performing poly pull pre-clean by $NH_3+NF_3$ etch or BHF WETs etch for native oxide breakthrough, performing poly pull by $NF_3+H_2$ radical etch, performing poly pull post-clean by SC1/SC2 (RCA clean) to remove etch by-products, and performing oxide strip and SiGe release post poly pull to form Si nanosheet (or Si release to form SiGe nanosheets).

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "over," "overlying," "atop," "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which the field effect transistor devices are fabricated. The term "vertical transistor" refers to a transistor with individual semiconductor components vertically oriented with respect to the major surface so that the current flows vertically from source to drain. By way of example, for a vertical FET, the source, channel, and drain regions are formed in relatively vertical alignment with respect to the major surface.

As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The fin structures are processed to provide, e.g., FinFETs. A field effect transistor (FET) is a semiconductor device in which output current, i.e., source-drain current, is controlled by the voltage applied to a gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

FIG. 1 is a cross-sectional view of a semiconductor structure including at least one fin structure formed on a substrate, the at least one fin structure surrounded by poly-Si, in accordance with an embodiment of the present invention.

A semiconductor structure 5 includes a semiconductor substrate 10 with a first fin structure 7 and a second fin structure 9 formed thereon. Each of the first and second fin structures 7, 9 includes a stack of alternating semiconductor layers. The first semiconductor layer can be, e.g., a Si layer 14 and the second semiconductor layer can be, e.g., a SiGe layer 16. The fin structures 7, 9 can be surrounded by a sacrificial layer 18. In one example, the sacrificial layer 18 can be, e.g., SiO$_2$. The fins 7, 9 extend vertically from the substrate 10. Stated differently, the fins 7, 9 are normal to or perpendicular to the substrate 10. The semiconductor structure 5 can be surrounded by poly-Si 12. The semiconductor structure 5 height can be, e.g., between about 30 nm and 100 nm.

In one or more embodiments, the substrate 10 can be a semiconductor or an insulator with an active surface semiconductor layer. The substrate 10 can be crystalline, semicrystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The substrate 10 can be etched by reactive ion etching (RIE) to provide a directional etch with control of sidewall etching. In various embodiments, the substrate 10 can be etched using a dry plasma etch.

In various embodiments, the fins 7, 9 can have a width in the range of about 6 nm to about 20 nm, or can have a width in the range of about 8 nm to about 15 nm, or in the range of about 10 nm to about 12 nm.

In various embodiments, the fins 7, 9 can have a height in the range of about 25 nm to about 75 nm, or in the range of about 40 nm to about 50 nm.

The vertical fins 7, 9 can be formed by a sidewall image transfer (SIT) process. An active semiconductor layer can be epitaxially grown on the substrate to a predetermined thickness, where the source can be buried beneath the active layer. A fin template layer, which can be a hard mask layer, can be formed on the active layer. A mandrel layer can be formed on the fin template layer, where the mandrel layer can be, for example, amorphous silicon or silicon germanium, for forming dummy mandrels. A mandrel template layer can be formed on the mandrel layer, where the mandrel template layer can be a hard mask layer. A soft mask layer can be formed on the mandrel template layer, where the soft mask layer can be patterned and developed to form a mandrel pattern exposing portions of the mandrel template layer. The mandrel pattern can be transferred from the soft mask layer to the mandrel template layer and mandrel layer by anisotropic directional etching, for example, a dry plasma etch or reactive ion etch (RIE), to form one or more dummy mandrels. Spacers can be formed on the sidewalls of the mandrels, for example, by a blanket or conformal deposition and etch back. The spacers can form a fin pattern that can be transferred to the fin template layer to form fin templates and the active layer to form a plurality of vertical fins by RIE.

The oxide layer 18 is deposited on the fins 7, 9. The oxide layer 18 encompasses or envelops the fins 7, 9. In various embodiments, the oxide layer 18 can be silicon oxide (e.g., SiO$_2$) or a silicon oxide/silicon borocarbonitride (SiBCN) bilayer, which can be formed by chemical vapor deposition (CVD), ALD, or a combination thereof. The silicon oxide 18 of the bilayer can be directly on the vertical sides of the fins 7, 9, and the SiBCN can be formed on the silicon oxide. The oxide layer 18 can be a sacrificial material or sacrificial layer. The SiBCN etch selectivity can be greater than 300:1. The ILD oxide etch selectivity can be greater than 2000:1. The SiN spacer selectivity can be greater than 500:1.

The sacrificial material 18 can be planarized and etched back for formation over the fins 7, 9. The planarization can be achieved by wet etching, for example, a sulfuric acid, hydrogen peroxide mixture (SPM) cleaning process, or the planarization can be achieved by ashing.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
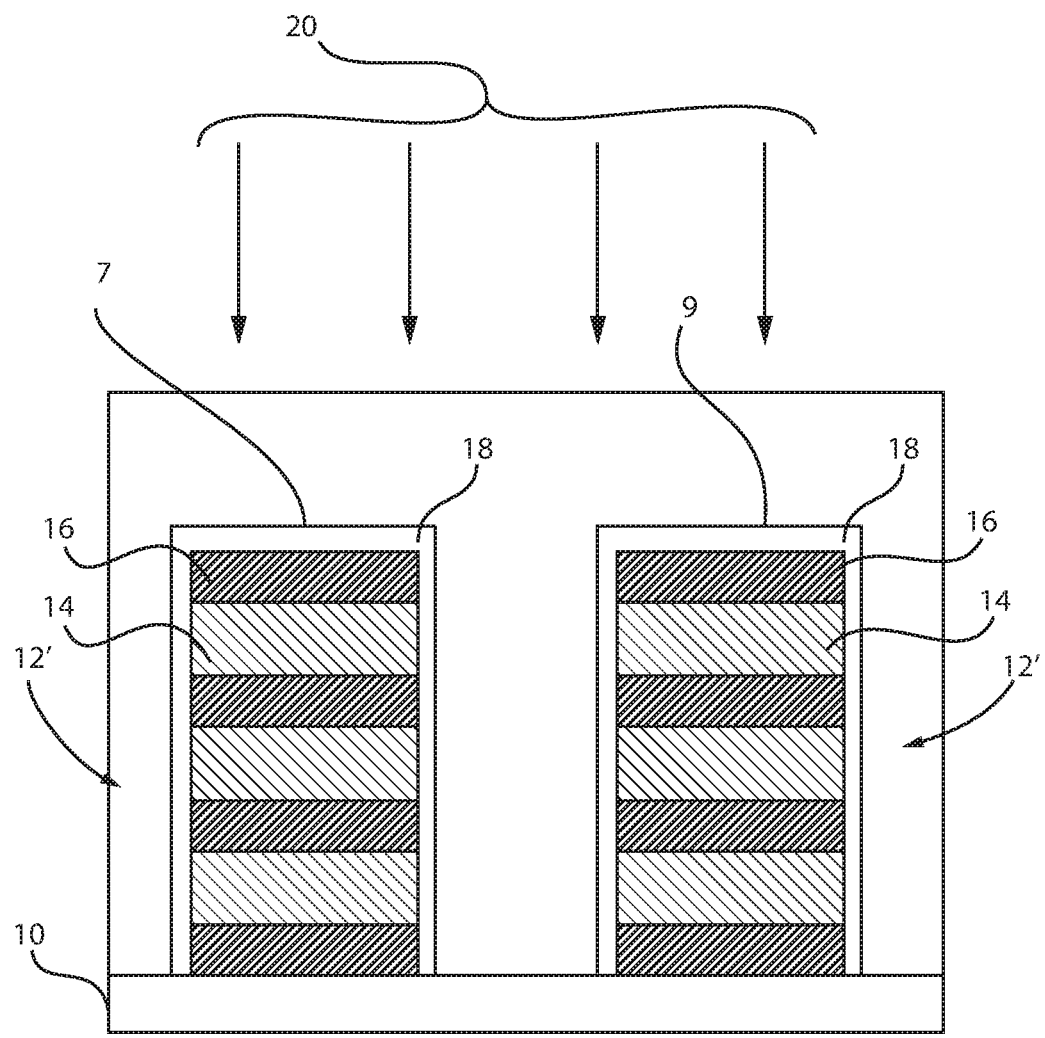
FIG. 2 is a cross-sectional view of the semiconductor structure of FIG. 1 illustrating a partial low rate etch of the poly-Si, in accordance with an embodiment of the present invention.

FIG. 2 is a cross-sectional view of the semiconductor structure of FIG. 1 illustrating a partial low rate etch of the poly-Si, in accordance with an embodiment of the present invention.

The low rate etch 20 can be, e.g., a reactive ion etch (RIE) 20. The low rate etch 20 etches away a portion of the poly-Si 12, such that poly-Si 12' remains. Poly-Si 12' still surrounds the entire fin structures 7, 9 after the low rate etch 20. The low rate etch 20 basically etches away an upper portion of the poly-Si 12 of FIG. 1. The poly-Si 12' remains on the upper portion of the substrate 10.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
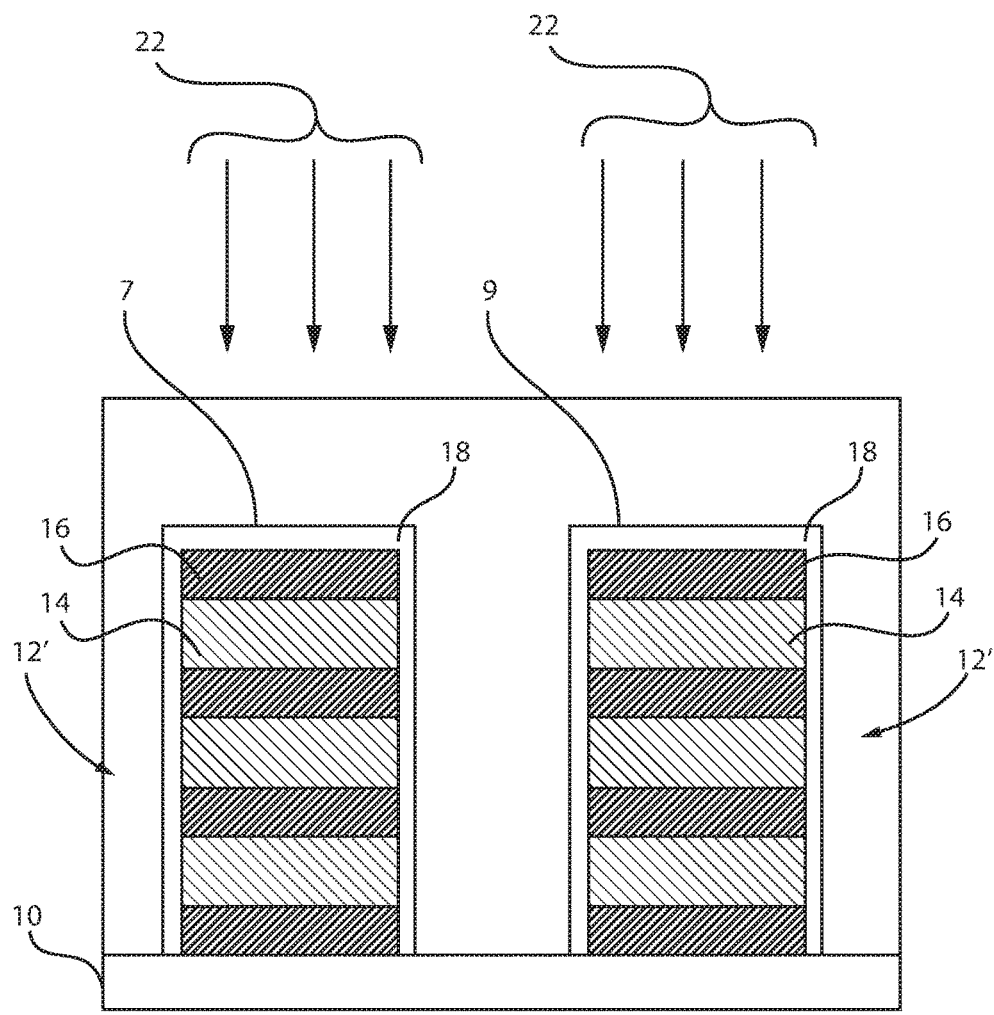
FIG. 3 is a cross-sectional view of the semiconductor device of FIG. 2 illustrating pre-cleaning of the remaining poly-Si, in accordance with an embodiment of the present invention.

FIG. 3 is a cross-sectional view of the semiconductor device of FIG. 2 illustrating pre-cleaning of the remaining poly-Si, in accordance with an embodiment of the present invention.

The pre-cleaning 22 is performed by NH$_3$+NF$_3$ (ammonia and nitrogen trifluoride) etch or BHF (buffered hydrofluoric acid) WETs etch for native oxide breakthrough. The pre-cleaning can be performed by using a variety of different plasmas.

In various embodiments, an etching gas mixture is introduced to a chamber (not shown) for selectively removing various oxides on a surface of the poly-Si 12'. In one embodiment, ammonia and nitrogen trifluoride gases are then introduced into the chamber to form the etching gas mixture. The amount of each gas introduced into the chamber is variable and can be adjusted to accommodate, for example, the thickness of the oxide layer to be removed, the geometry of the substrate being cleaned, the volume capacity of the plasma, the volume capacity of the chamber body, as well as the capabilities of the vacuum system coupled to the chamber body.

The ratio of the etching gas mixture can be predetermined to selectively remove various oxides on the substrate surface. In one embodiment, the ratio of ingredient in the etching gas mixture can be adjusted to uniformly remove various oxides, such as thermal oxides, deposited oxides, and/or native oxides. In one embodiment, molar ratio of ammonia to nitrogen trifluoride in the etching gas mixture can be set to uniformly remove various oxides. In one aspect, the gases are added to provide a gas mixture having at least a 1:1 molar ratio of ammonia to nitrogen trifluoride. In another aspect, the molar ratio of the gas mixture is at least about 3 to 1 (ammonia to nitrogen trifluoride). In one embodiment, the gases are introduced in the chamber at a molar ratio of from 5:1 (ammonia to nitrogen trifluoride) to 30:1. In another embodiment, the molar ratio of the gas mixture is of from about 5 to 1 (ammonia to nitrogen trifluoride) to about 10 to 1. The molar ratio of the gas mixture can also fall between about 10:1 (ammonia to nitrogen trifluoride) and about 20:1.

A purge gas or carrier gas can also be added to the etching gas mixture. Any suitable purge/carrier gas can be used, such as argon, helium, hydrogen, nitrogen, or mixtures thereof, for example. Typically, the overall etching gas mixture is from about 0.05% to about 20% by volume of ammonia and nitrogen trifluoride. The remainder being the carrier gas. In one embodiment, the purge or carrier gas is first introduced into the chamber body before the reactive gases to stabilize the pressure within the chamber body.

The operating pressure within the chamber body can be variable. Typically, the pressure is maintained between about 500 mTorr and about 30 Torr. In one embodiment, the pressure is maintained between about 1 Torr and about 5 Torr.

In various embodiments, chemical oxide etch removal (COR) is used to selectively etch sacrificial oxide layers, e.g., thermal grown oxides and deposited oxide, from a SOI containing structure. The COR processing step comprises exposing the structure to a gaseous mixture of HF and ammonia at a pressure of about 30 mTorr or below, usually at a pressure between about 1 mTorr and about 10 mTorr, and a temperature of about 25° C. or a temperature slightly above room temperature. The ratio of gaseous HF to gaseous ammonia is from about 1:10 to about 10:1, with a ratio of about 2:1 being more highly preferred.

The terms "gas" and "gases" are used interchangeably, unless otherwise noted, and refer to one or more precursors, reactants, catalysts, carrier, purge, cleaning, combinations thereof, as well as any other fluid introduced into the chamber body.

Figure 4:
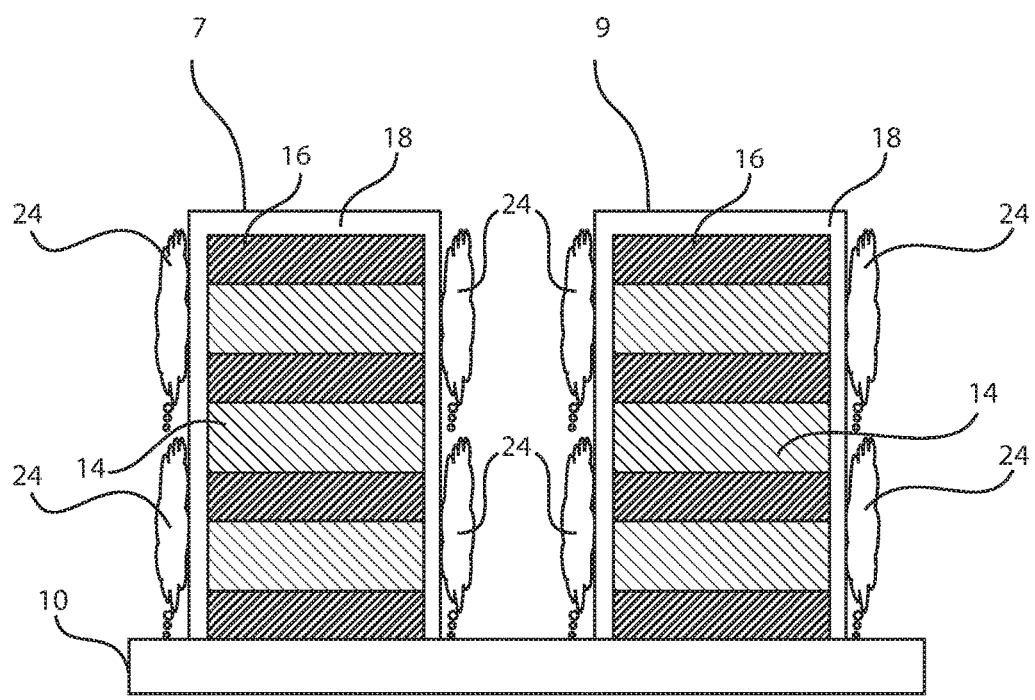
FIG. 4 is a cross-sectional view of the semiconductor device of FIG. 3 illustrating poly-Si residue remaining after a high rate etch process, in accordance with an embodiment of the present invention.

FIG. 4 is a cross-sectional view of the semiconductor device of FIG. 3 illustrating poly-Si residue remaining after a high rate etch process, in accordance with an embodiment of the present invention.

After the pre-cleaning 22 is performed (FIG. 3), a chemical etch takes place by using, e.g., $NF_3$ (nitrogen trifluoride) and $H_2$ (hydrogen). This results in residue 24 remaining around portions of the oxide layer 18 of the fins 7, 9. However, the remaining poly-Si 12' is removed to expose the oxide layer 18 of the fins 7, 9 with the residue 24. The residue 24 can be present on various portions of the oxide layer 18.

In various embodiments, the $NF_3$ flow is about 100 sccm-300 sccm and the $H_2$ flow is about 1000 sccm-5000 sccm. The second etching process has an etch rate of about 200 A/min. The second etching process has an anneal time of about 1 min to about 5 mins.

A solid reaction product is formed as a result of the structure's exposure to HF and ammonia gas. The solid reaction product includes etched oxide, reactants or combinations thereof. The solid reaction product is removed in a second step which includes heating the structure to a temperature about 100° C., thus causing the reaction product to evaporate and rinsing the structure in water, or removing with an aqueous solution.

Therefore, when an object to be processed on which a silicon oxide film is formed is treated by using HF gas and $NH_3$ gas that are reactant gases, and a reaction product generated by reacting the reactant gases with the silicon oxide film is etched and removed by heating and decomposition, no etching residue occurs and an etching profile with high verticality can be obtained by adjusting the amount of a diluent gas added to the reactant gases to increase the pressure in the chamber.

Thus, there is provided an oxide etching method including supplying HF gas and $NH_3$ gas as reactant gases to the chamber to conduct a reaction treatment in which the HF gas and $NH_3$ gas are reacted with the silicon oxide film, and performing a heating process to remove a reaction product generated by the reaction treatment, wherein, in one example embodiment, a diluent gas can be supplied to the chamber in addition to the HF gas and the $NH_3$ gas serving as reactant gases, and an amount of the diluent gas is adjusted to regulate a pressure in the chamber such that no etching residue remains and an etching shape has high verticality.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 5:
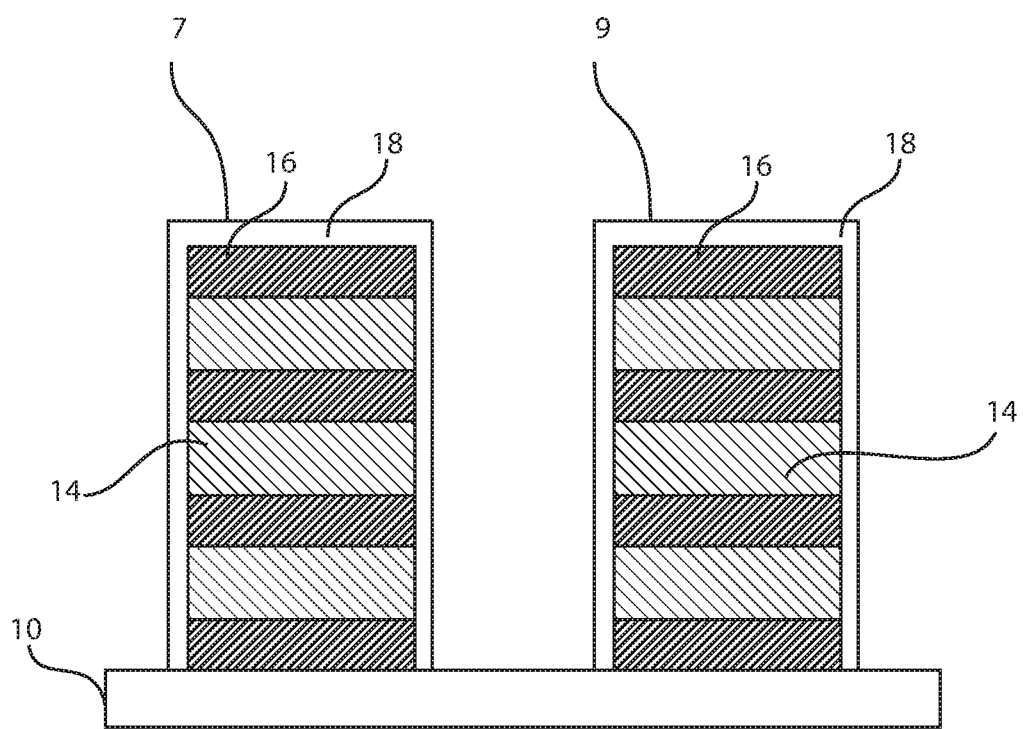
FIG. 5 is a cross-sectional view of the semiconductor device of FIG. 4 illustrating removal of the poly-Si etch residue, in accordance with an embodiment of the present invention.

FIG. 5 is a cross-sectional view of the semiconductor device of FIG. 4 illustrating removal of the poly-Si etch residue, in accordance with an embodiment of the present invention.

The residue 24 is removed to clearly expose the oxide layer 18 of the fins 7, 9. The residue 24 is removed without damaging the oxide layer 18. The post-etch anneal temperature is about 150° C.-200° C. and the post etch anneal time is about 1 min to 5 mins.

In one embodiment and in the first step of the cleaning process, oxide material, such as silicon oxide or silicon oxynitride, is removed from the surface of the first semiconductor layer of the substrate 10 by the application of a solution of hydrofluoric acid. Hydrofluoric acid is used to etch silicon oxide ($SiO_2$) films on silicon substrates, because the hydrofluoric acid etches the silicon oxide without attacking the silicon surface. The hydrofluoric acid it typically diluted with deionized (DI) water in order to slow down the etch rate of the silicon oxide, thereby ensuring better etch uniformity. In one embodiment, the dilution ratio ranges from 1:1 $HF:H_2O$ to 300:1 $H_2O:HF$. In another embodiment, the hydrofluoric acid can be diluted with ammonium fluoride ($NH_4F$).

Following the surface treatment with hydrofluoric acid, the removal of particles and residual metallic contamination continues with an RCA clean process, which in some embodiments provides the second and third steps of the chemical cleaning process. In one embodiment, the RCA clean includes a treatment of the first semiconductor layer of the substrate 5 in a solution of ammonium hydroxide and hydrogen peroxide followed by an aqueous mixture of hydrochloric acid and an oxidizing agent (e.g., $H_2O_2$, $O_3$).

The first step of the RCA clean that includes ammonium hydroxide and hydrogen peroxide can be referred to as "SC-1" (standard clean #1). SC-1 includes of a mixture of ammonium hydroxide and hydrogen peroxide and deionized water. A typical concentration ratio for the mix is 1:1:5 $NH_4OH:H_2O_2:H_2O$, although ratios as low as 0.05:1:5 are suitable for cleaning the substrate 5. SC-1 typically operates in a temperature ranging from 50° C. to 70° C.

The second step of the RCA clean that includes the aqueous mixture of hydrochloric acid and an oxidizing agent that can be referred to as "SC-2" (standard clean #2). SC-2 includes a mixture of hydrochloric acid, hydrogen peroxide, and deionized water. A typical concentration ratio for the mix is 1:1:5 $HCl:H_2O_2:H_2O$. SC-2 is typically operated in the temperature range of 50-70° C.

In another embodiment, the chemical cleaning process is provided by a hydrofluoric acid last process. In this embodiment, oxide material, such as silicon oxide or silicon oxynitride, is removed from the first semiconductor layer of the substrate 5 by the application of a solution of hydrofluoric acid. The hydrofluoric acid is typically diluted with deionized water in order to slow down the etch rate of the silicon oxide, thereby ensuring better etch uniformity. In one embodiment, the dilution ratio ranges from 1:1 $HF:H_2O$ to 300:1 $H_2O:HF$. In another embodiment, the hydrofluoric acid can be diluted with ammonium fluoride ($NH_4F$).

Figure 6:
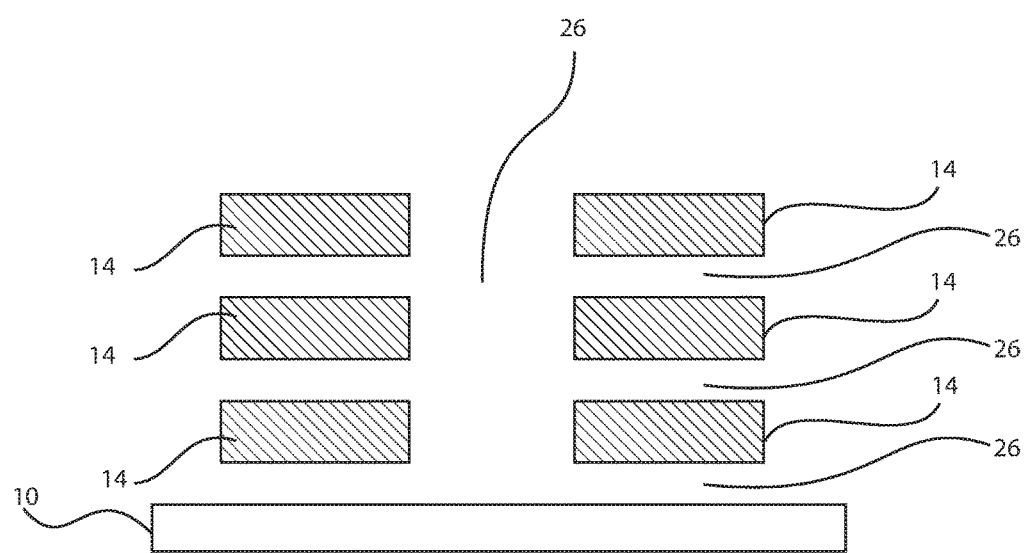
FIG. 6 is a cross-sectional view of the semiconductor device of FIG. 5 illustrating stripping of the dummy Si or SiGe from the at least one fin structure to form nanosheet MOSFETs, in accordance with an embodiment of the present invention.

FIG. 6 is a cross-sectional view of the semiconductor device of FIG. 5 illustrating stripping of the dummy Si or SiGe from the at least one fin structure to form nanosheet MOSFETs, in accordance with an embodiment of the present invention.

In various embodiments, the oxide is stripped and SiGe release post poly pull is performed to form Si nanosheet (or Si release to form SiGe nanosheets). As shown, the SiGe layers are removed and the Si layers 14 remain behind to form the nanosheets. Gaps 26 are formed where the SiGe has been removed.

In some embodiments, a width of the plurality of nanosheets can be in a range of about 10 nm to about 30 nm in a first direction that is parallel to the surface of the substrate 10. In some embodiments, a thickness of the plurality of nanosheets can be in a range of about 2 nm to about 8 nm in a second direction that is perpendicular to the surface of the substrate 10. In some embodiments, a thickness of ones of the plurality of nanosheets can be in a range of about 3 nm to about 6 nm in the second direction that is perpendicular to the surface of the substrate 10.

The nanosheets can include a thin layer of conducting channel material. For example, in some embodiments, one or more of the nanosheets can include Si, SiGe, Ge, and/or a Group III-V semiconductor material, for example InGaAs, but the inventive concept is not limited thereto. The term "Si nanosheet FET" refers to nanosheet FETs with nanosheets including Si or including a large percentage of Si, for example $Si_xGe_{1-x}$, where x is greater than about 0.3. The term "non-Si nanosheet FET" refers to nanosheet FETs with nanosheets not including Si, for example InGaAs, or including a small percentage of Si, for example $Si_yGe_{1-y}$, where y is less than about 0.3.

A non-Si nanosheet FET can have a higher channel carrier mobility than an equivalent Si nanosheet FET. The higher channel carrier mobility can result in higher performance. However, the non-Si nanosheet FET can also have higher band-to-band tunneling (BTBT) leakage current than the equivalent Si nanosheet FET. In general, high BTBT leakage current can occur in the same device design range as high channel carrier mobility. Several factors can induce higher BTBT leakage current in a non-Si nanosheet FET. For example, a parasitic-bipolar-effect (PBE) can effectively multiply a BTBT leakage current by a large value for non-Si nanosheet FETs with nanosheets including $Si_yGe_{1-y}$, where y is less than about 0.3, to result in a net BTBT-induced leakage current that is significantly high.

The methods described with respect to FIGS. 1-6 can include different masking and etching processes. Masking and etching can include patterning and etching the stacked layers into desired dimensions to define the width of each nanosheet and horizontal spacing between each nanosheet, in each horizontal plane. In some embodiments, the length of each nanosheet can also be defined within this action but, in some embodiments, can be defined at another action. A single mask and etch, or multiple masks and etches, can be used to define the width and spacing between each nanosheet, in each horizontal plane. In some embodiments, an etch, for example a dry etch, that is not selective to either of the conduction channel material or sacrificial material can be utilized. In some embodiments, a multiple-etch process using different etch gas chemistries to selectively etch each of the conduction channel material and sacrificial material can be utilized. The methods can include forming dummy gates (not shown), forming spacers (not shown), depositing dielectric material (not shown), removing dummy gates (not shown), and removing sacrificial material (FIG. 4). In some embodiments, removing sacrificial material can include a wet etch process and/or combination wet/dry etch.

Figure 7:
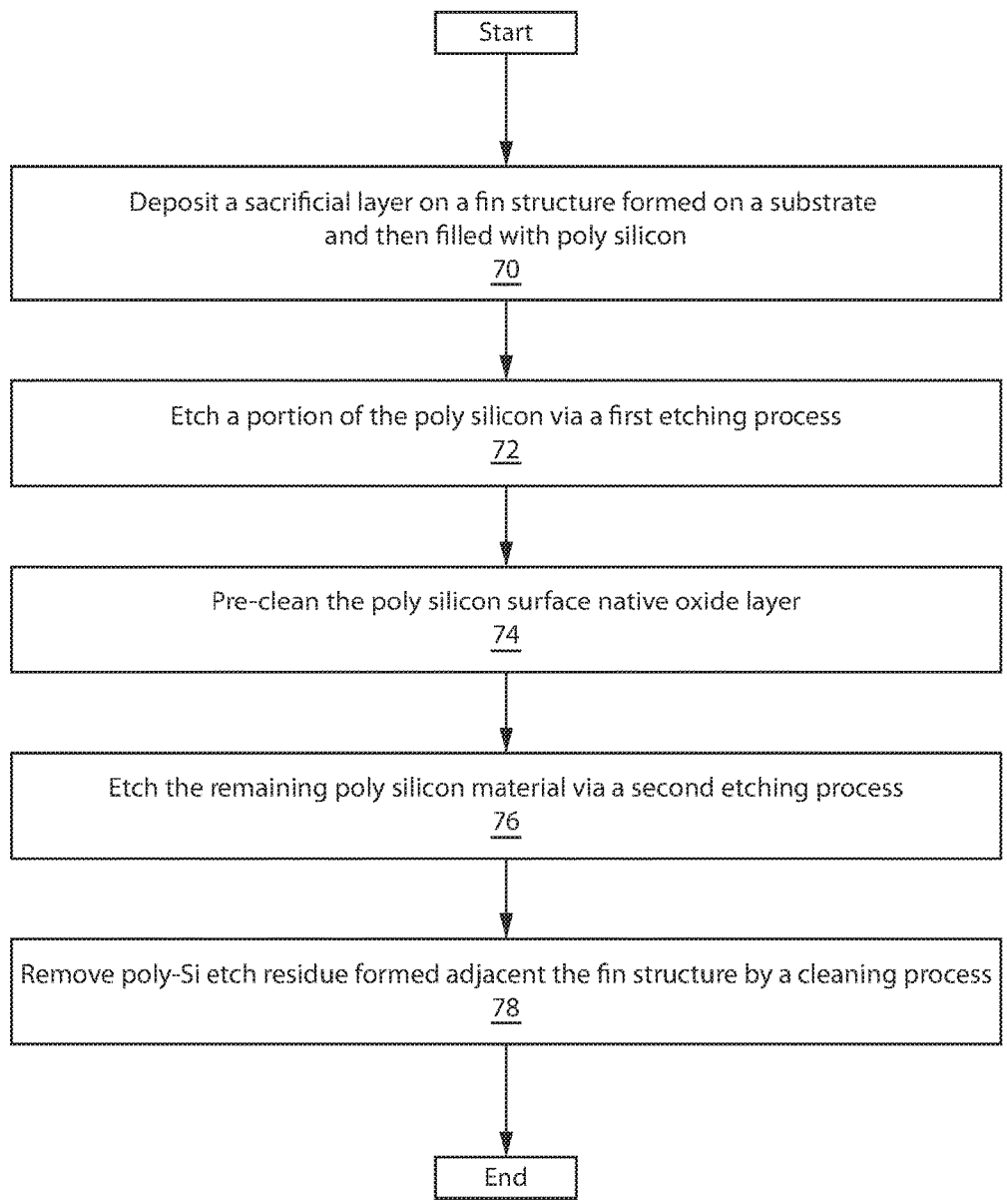
FIG. 7 is a block/flow diagram of an exemplary method for forming a semiconductor device, in accordance with an embodiment of the present invention.

FIG. 7 is a block/flow diagram of an exemplary method for forming a semiconductor device, in accordance with an embodiment of the present invention.

At block 70, a sacrificial layer is deposited on a fin structure formed on a substrate. The sacrificial layer can be, e.g., silicon dioxide.

At block 72, a portion of the polysilicon material is etched via a first etching process. The first etching process can be, e.g., an RIE process.

At block 74, the native oxide layer on polysilicon is pre-cleaned. In one example, pre-cleaning is performed by applying $NH_3$ (ammonia) and $NF_3$ (nitrogen trifluoride). In another example, pre-cleaning is performed by applying BHF (buffered hydrofluoric acid).

At block 76, the remaining polysilicon material is etched via a second etching process. The second etching process involves, e.g., applying $NF_3$ and $H_2$ (hydrogen gas).

At block 78, polysilicon etch residue formed adjacent the fin structure is removed by a cleaning process. The cleaning process can be, e.g., a WETs RT SC1/SC2 process.

Therefore, the methods provide for an improved process for the selective removal of residues, and in particular, sidewall residues left on oxide layer portions of fins, after an anisotropic etching step, with minimum damage to oxide portions in or on the integrated circuit structure such as an oxide over the silicon substrate, including elimination of undercutting of the remaining portions. The methods described herein refer to an isotropic process from the nature of the radical etch and lead to complete polysilicon removal without any poly residues.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers may also be present.

It will be understood that, although the terms first, second, etc. can be used herein to describe various elements, these elements should not be limited by these terms. These terms are only used to distinguish one element from another element. Thus, a first element could be termed a second element without departing from the scope of the present concept.

Having described preferred embodiments of a method of device fabrication and a semiconductor device thereby fabricated (which are intended to be illustrative and not limiting) for polysilicon residue removal, it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, the method comprising:

etching a portion of a polysilicon material deposited over a dielectric layer of a fin via a first etching process such that remaining polysilicon material covers the fin;

etching the remaining polysilicon material via a second etching process resulting in polysilicon etch residue formed on portions of the fin; and removing the polysilicon etch residue by a cleaning process.

2. The method of claim 1, wherein the fin is formed by alternating layers of silicon (Si) and silicon germanium (SiGe).

3. The method of claim 1, wherein the cleaning process exposes the dielectric layer.

4. The method of claim 1, wherein the cleaning process is a wet etch cleaning process.

5. The method of claim 1, further comprising pre-cleaning a surface of the remaining polysilicon material.

6. The method of claim 5, wherein the pre-cleaning is performed by applying ammonia ($NH_3$) and nitrogen trifluoride ($NF_3$).

7. The method of claim 5, wherein the pre-cleaning is performed by applying buffered hydrofluoric acid (BHF).

8. The method of claim 1, wherein the first etching process is reactive ion etching (RIE) and the second etching process involves applying nitrogen trifluoride ($NF_3$) and hydrogen gas ($H_2$).

9. The method of claim 8, wherein the nitrogen trifluoride ($NF_3$) flow is about 100 sccm-300 sccm and the $H_2$ flow is about 1000 sccm-5000 sccm.

10. The method of claim 8, wherein the second etching process has an etch rate of about 200 Å/minute and an anneal time of about 1 minutes to about 5 minutes.

11. A method of forming nanosheet metal oxide semiconductor field effect transistors (MOSFETs), the method comprising:

forming a plurality of fins each including a first material and a second material arranged in an alternating configuration;

forming a polysilicon material over the plurality of fins;

etching a portion of the polysilicon material deposited via a first etching process such that remaining polysilicon material covers the plurality of fins;

etching the remaining polysilicon material via a second etching process resulting in polysilicon etch residue formed on the plurality of fins;

removing the polysilicon etch residue by a cleaning process; and removing either the first material or the second material to form the nanosheet MOSFETs.

12. The method of claim 11, wherein the first material is silicon (Si) and the second material is silicon germanium (SiGe).

13. The method of claim 11, wherein the cleaning process is a wet etch cleaning process.

14. The method of claim 11, further comprising pre-cleaning a surface of the remaining polysilicon material.

15. The method of claim 14, wherein the pre-cleaning is performed by applying ammonia ($NH_3$) and nitrogen trifluoride ($NF_3$).

16. The method of claim 14, wherein the pre-cleaning is performed by applying buffered hydrofluoric acid (BHF).

17. The method of claim 14, wherein the pre-cleaning involves an isotropic process.

18. The method of claim 11, wherein the first etching process is reactive ion etching (RIE) and the second etching process involves applying nitrogen trifluoride ($NF_3$) and hydrogen gas ($H_2$).

19. The method of claim 11, wherein the plurality of fins include a dielectric liner formed before deposition of the polysilicon material.

20. The method of claim 19, wherein the cleaning process exposes the dielectric layer.

* * * * *